United States Patent
Yamanaka et al.

(10) Patent No.: US 9,881,818 B2
(45) Date of Patent: Jan. 30, 2018

(54) METHOD FOR MANUFACTURING SEMICONDUCTOR DEVICE

(71) Applicant: Mitsubishi Electric Corporation, Tokyo (JP)

(72) Inventors: Nobuaki Yamanaka, Tokyo (JP); Daisuke Chikamori, Tokyo (JP); Shinichirou Katsuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/318,925

(22) PCT Filed: Sep. 19, 2014

(86) PCT No.: PCT/JP2014/074881
§ 371 (c)(1),
(2) Date: Dec. 14, 2016

(87) PCT Pub. No.: WO2016/042667
PCT Pub. Date: Mar. 24, 2016

(65) Prior Publication Data
US 2017/0154798 A1    Jun. 1, 2017

(51) Int. Cl.
*H01L 21/67* (2006.01)
*H01L 21/308* (2006.01)
(Continued)

(52) U.S. Cl.
CPC ......... *H01L 21/67086* (2013.01); *C23F 1/38* (2013.01); *H01L 21/0495* (2013.01);
(Continued)

(58) Field of Classification Search
CPC ........... H01L 21/67086; H01L 21/0495; H01L 29/1608; H01L 29/47; C23F 1/38
See application file for complete search history.

(56) References Cited

U.S. PATENT DOCUMENTS

2002/0001967 A1* 1/2002 Yokomizo ......... H01L 21/31111
438/745
2002/0076930 A1 6/2002 Jo et al.
(Continued)

FOREIGN PATENT DOCUMENTS

JP   09-042600 A    2/1997
JP   2002-241968 A  8/2002
(Continued)

OTHER PUBLICATIONS

Notification of Transmittal of Translation of the International Preliminary Report on Patentability (Chapter I) and Translation of Written Opinion of the International Searching Authority; PCT/JP2014/074881; dated Mar. 30, 2017.
(Continued)

*Primary Examiner* — Karen Kusumakar
(74) *Attorney, Agent, or Firm* — Studebaker & Brackett PC

(57) ABSTRACT

A method for manufacturing a semiconductor device, includes: a preparation step, a flow step, and a processing step. The preparation step prepares an etching solution by dissolving titanium in an ammonia-hydrogen peroxide solution in advance before use of the ammonia-hydrogen peroxide solution for etching. The flow step flows the etching solution after the preparation step so that a concentration of the etching solution in a processing bath is constant. The processing step etches a metal film on a semiconductor wafer with the etching solution by putting in the processing bath the semiconductor wafer having a resist film and the metal film after the flow step is started. The metal film is preferably formed of titanium, and a temperature of the etching solution is preferably adjusted by flowing the etching solution so that the etching solution flows via a temperature controller.

5 Claims, 5 Drawing Sheets

(51) Int. Cl.
   *H01L 21/04*    (2006.01)
   *H01L 29/16*    (2006.01)
   *H01L 29/47*    (2006.01)
   *C23F 1/38*     (2006.01)

(52) U.S. Cl.
   CPC ........ *H01L 21/308* (2013.01); *H01L 29/1608* (2013.01); *H01L 29/47* (2013.01)

(56) References Cited

U.S. PATENT DOCUMENTS

2004/0157452 A1\* 8/2004 Ogawa .............. H01L 21/31111
                                                    438/691
2006/0247803 A1\* 11/2006 Mori ................... G05B 23/027
                                                    700/80

FOREIGN PATENT DOCUMENTS

| JP | 2004-266207 | \* | 9/2004 |
| JP | 2004-266207 | A | 9/2004 |
| JP | 2006-210778 | \* | 8/2006 |
| JP | 2006-210778 | A | 8/2006 |
| JP | 2009-267115 | A | 11/2009 |
| JP | 2014-011342 | A | 1/2014 |

OTHER PUBLICATIONS

International Search Report issued in PCT/JP2014/074881; dated Dec. 16, 2014.
JP Office Action dated Nov. 28, 2017, from corresponding JP Appl No. 2016-548517, with English translation, 8 pp.

\* cited by examiner

US 9,881,818 B2

METHOD FOR MANUFACTURING SEMICONDUCTOR DEVICE

FIELD

The present invention relates to a method for manufacturing a semiconductor device.

BACKGROUND

Various techniques of inhibiting changes in etching rate are known with respect to wet etching on metal film, as described in Patent Literatures 1 and 2 shown below.

CITATION LIST

Patent Literature

[PTL 1] JP 2002-241968 A
[PTL 2] JP 2009-267115 A

SUMMARY

Technical Problem

In a semiconductor manufacturing process, wet etching on titanium film is performed by using an ammonia-hydrogen peroxide solution. A technique of circulating an etching solution for concentration uniformization or temperature stabilization is also known. However, if the ammonia-hydrogen peroxide solution is circulated, the decomposition of hydrogen peroxide is promoted and, therefore, the concentration of hydrogen peroxide lowers with passage of time. The etching rate is strongly influenced by the concentration of hydrogen peroxide. Therefore, the etching rate is reduced as time elapses after the preparation of the ammonia-hydrogen peroxide solution, and the etching rate cannot be constantly maintained.

The present invention has been achieved to solve the above-described problem, and an object of the present invention is to provide a semiconductor device manufacturing method capable of constantly maintaining the etching rate for a long time period.

Solution to Problem

A method for manufacturing a semiconductor device according to the present invention, includes: a preparation step of preparing an etching solution by dissolving titanium in an ammonia-hydrogen peroxide solution in advance before use of the ammonia-hydrogen peroxide solution for etching; a flow step of flowing the etching solution after the preparation step so that a concentration of the etching solution in a processing bath is constant; and a processing step of etching a metal film on a semiconductor wafer with the etching solution by putting in the processing bath the semiconductor wafer having a resist film and the metal film after the flow step is started.

Advantageous Effect of Invention

According to the present invention, the etching rate can be constantly maintained for a long time period by inhibiting the decomposition of hydrogen peroxide in an ammonia-hydrogen peroxide solution.

DESCRIPTION OF EMBODIMENT

Figure 1:
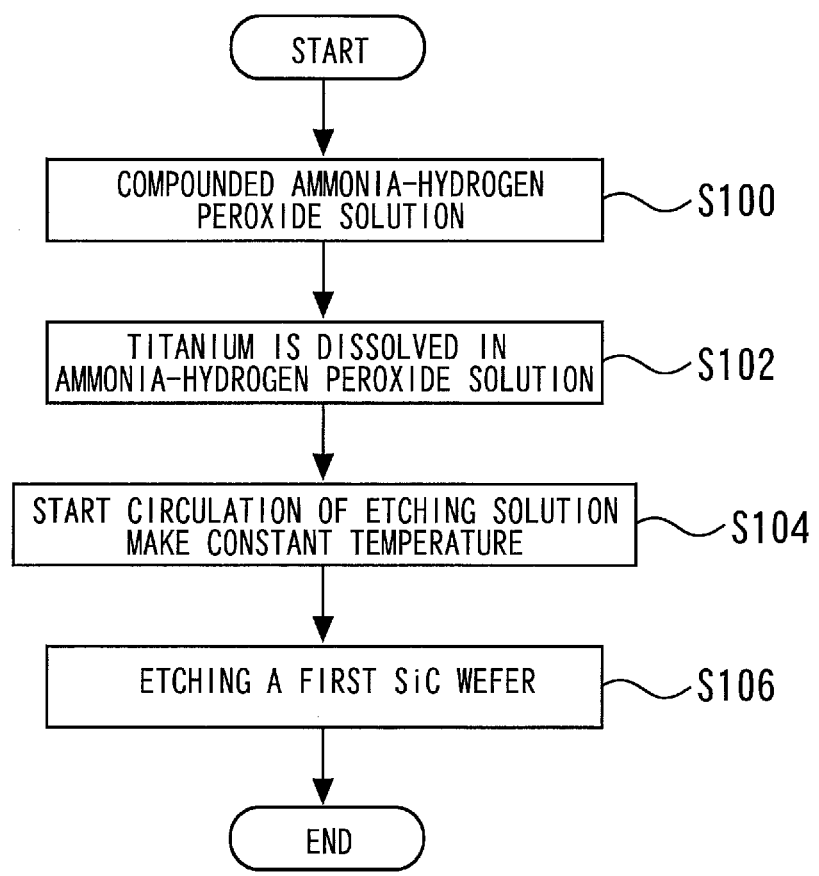
FIG. 1 is a flowchart showing a method for manufacturing a semiconductor device according to an embodiment of the present invention.
Figure 2:
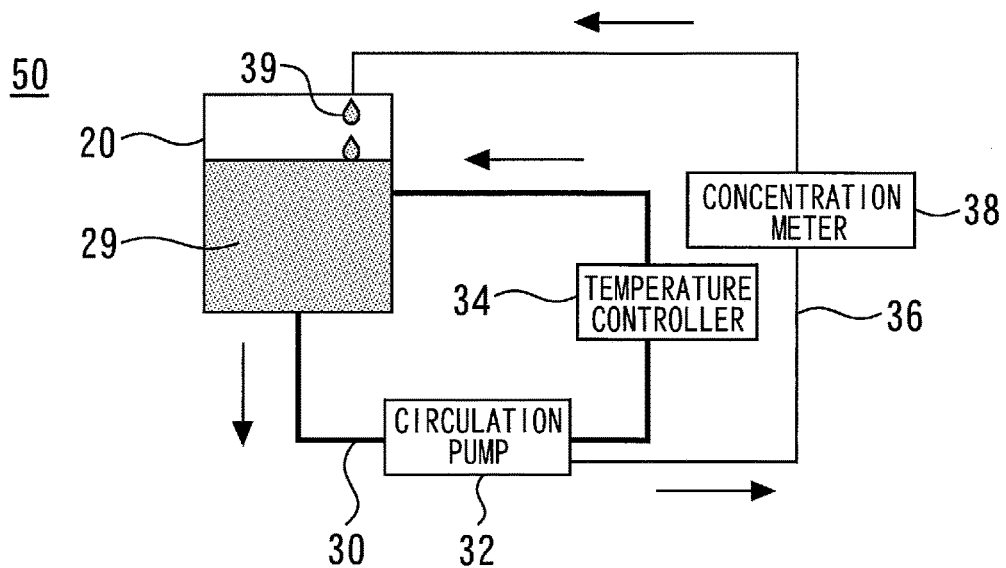
FIG. 2 is a diagram showing a wet etching apparatus according to the embodiment of the present invention.
Figure 3:
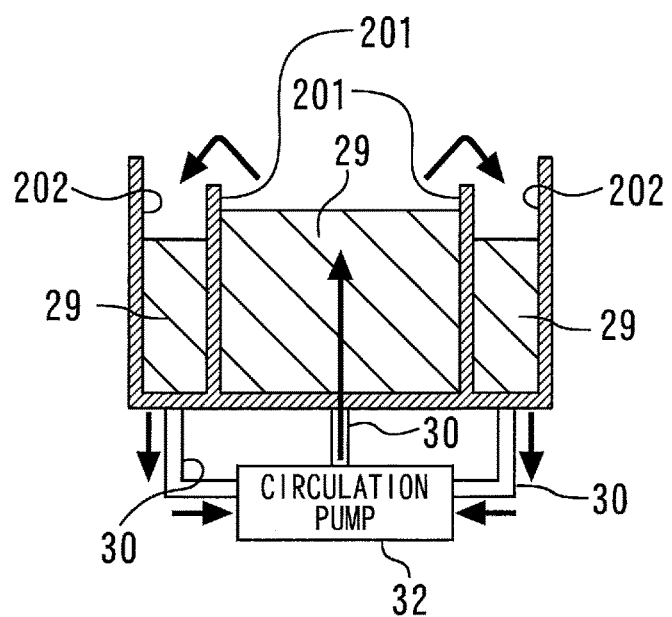
FIG. 3 is a diagram showing a wet etching apparatus according to the embodiment of the present invention.

FIG. 1 is a flowchart showing a method for manufacturing a semiconductor device according to an embodiment of the present invention. FIGS. 2 and 3 are diagrams showing a wet etching apparatus 50 according to the embodiment of the present invention. In the present embodiment, an etching process shown in the flowchart of FIG. 1 is performed by using the wet etching apparatus 50 to etch a titanium film 14 on a silicon carbide (SiC) wafer 10 shown in FIG. 6.

As shown in FIG. 2, the wet etching apparatus 50 is provided with a processing bath 20, a first piping 30, a circulation pump 32, a temperature controller 34, a second piping 36 and a concentration meter 38. An etching solution 29 is stored in the processing bath 20. One end and the other end of the first piping 30 are connected to the processing bath 20 for the purpose of circulating the etching solution 29 therein. The circulation pump 32 and the temperature controller 34 are provided at intermediate positions in the first piping 30. The etching solution 29 can be circulated through the first piping 30 by operating the circulation pump 32. The temperature controller 34 is provided at an intermediate position in the first piping 30. The etching solution 29 is caused to flow through the temperature controller 34 to enable control of the temperature of the etching solution 29. One end of the second piping 36 is connected to an outlet of the circulation pump 32, while the other end of the second piping 36 is positioned above the processing bath 20. Droplets 39 of the etching solution 29 can be fed from the other end of the second piping 36. The concentration meter 38 is provided at an intermediate position in the second piping 36. From a value measured with the concentration meter 38, the concentration of the circulated etching solution 29 can be known. For example, the rate of flow in the first piping 30 may be set to several liters per minute, and the rate of flow in the second piping 36 may be set to several cubic centimeters per minute.

As a concrete construction of the processing bath 20, a processing bath including a plurality of baths, for example, as shown in FIG. 3 may be used. FIG. 3 shows a sectional view of a processing bath 20. The processing bath 20 includes an inner bath 201 in which the SiC wafer 10 is to be put, and an outer bath 202 provided so as to surround the inner bath 201. The etching solution 29 overflowing from the inner bath 201 flows into the outer bath 202. The circulation pump 32 draws out the etching solution 29 in the outer bath 202 from one end of the first piping 30 connected to a bottom surface of the outer bath 202. The circulation pump 32 feeds the etching solution 29 into the inner bath 201 via the other end of the first piping 30 connected to a bottom surface of the inner bath 201. The etching solution 29 is thereby circulated in the processing bath 20. The present invention is not limited to the processing bath 20 having the two-bath structure shown in FIG. 3. A one-bath structure may suffice for the present invention. The etching solution 29 in the processing bath may be agitated by using well-known means other than the means for circulation using the first piping 30.

Steps shown in the flowchart of FIG. 1 will subsequently be described. First, in steps S100 and S102, the etching solution 29 is prepared. More specifically, the etching solution 29 is prepared by dissolving titanium in an ammonia-hydrogen peroxide solution 22 before etching use.

(Step S100)

Figure 4:
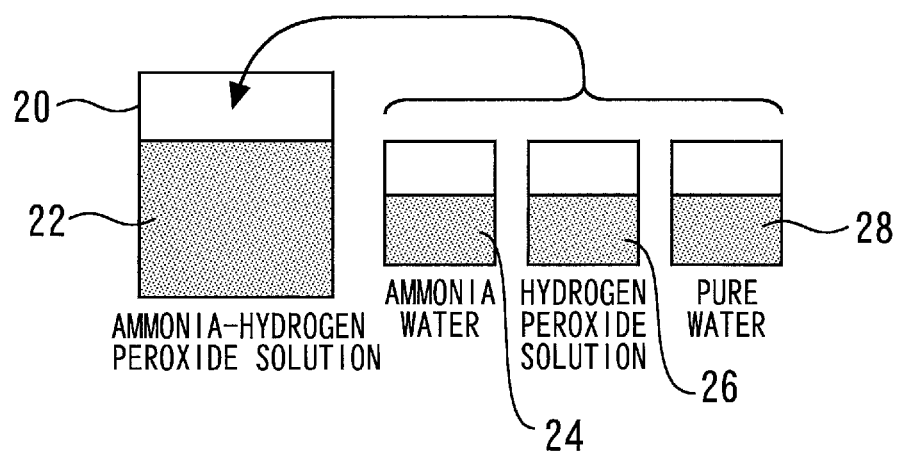
FIG. 4 is a diagram showing a step of preparing the etching solution according to the embodiment of the present invention.

First, in step S100, the ammonia-hydrogen peroxide solution 22 is compounded. FIG. 4 is a diagram showing a step of preparing the etching solution 29 according to the embodiment of the present invention. Ammonia water 24 having no titanium dissolved therein, a hydrogen peroxide solution 26 and pure water 28 are successively put in the processing bath 20, thereby preparing the ammonia-hydrogen peroxide solution 22. It is preferable to put each liquid at the time of preparation of the solution because the concentration changes if the solution is compounded in advance. The ammonia-hydrogen peroxide solution 22 is in a state of being used before etching, i.e., in an unused state, and therefore contains no metal such as titanium.

(Step S102)

Figure 5:
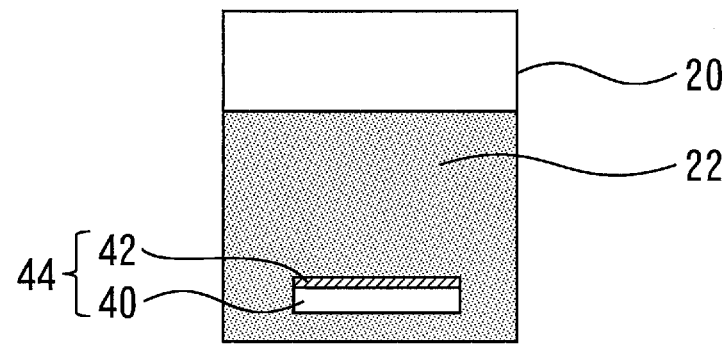
FIG. 5 is a diagram showing a step of preparing the etching solution according to the embodiment of the present invention.

Subsequently, the process advances to step S102 and titanium is dissolved in the ammonia-hydrogen peroxide solution 22. FIG. 5 is a diagram showing the step of preparing the etching solution 29 according to the embodiment of the present invention. Referring to FIG. 5, the titanium film 42 is dissolved in the ammonia-hydrogen peroxide solution 22, for example, by putting in the processing bath 20 a semiconductor wafer 44 having a titanium film 42 formed on a semiconductor substrate 40. e.g., a silicon (Si) substrate. The semiconductor wafer 44 is for dissolving titanium in the ammonia-hydrogen peroxide solution 22 in advance. Therefore, the semiconductor wafer 44, unlike the wafer on etching is to be performed, has no resist provided for patterning of the titanium film 42. The present invention is not limited to the embodiment using the semiconductor wafer 44. For example, fine titanium particles may be put in the processing bath 20. The etching solution 29 is completed by step S102.

(Step S104)

Subsequently, in step S104, the circulation pump 32 is operated in the apparatus arrangement shown in FIG. 2 to circulate the etching solution 29. In a preferable mode according to the present embodiment, the etching solution 29 in the processing bath 20 is circulated by using the circulation pump 32 in order to make constant the concentration and temperature of the etching solution 29 in the processing bath 20. The etching uniformity is improved by circulating the etching solution 29. That is, the concentration of the etching solution 29 in the processing bath 20 can be constantly maintained by circulating the etching solution 29 in the processing bath 20 with the circulation pump 32.

Since the temperature controller 34 is attached to the processing bath 20, and since the etching solution 29 is circulated so that the temperature of the etching solution 29 is constant, changes in etching speed with changes in temperature can also be inhibited.

When the ammonia-hydrogen peroxide solution is circulated, the decomposition of hydrogen peroxide is promoted and, therefore, the concentration of hydrogen peroxide becomes lower with passage of time. The etching rate is strongly influenced by the concentration of hydrogen peroxide. Therefore, the etching rate is reduced as time elapses after the preparation of the ammonia-hydrogen peroxide solution 22, and the etching rate cannot be constantly maintained. In particular, for two reasons described below, the decomposition of hydrogen peroxide tends to be promoted when the ammonia-hydrogen peroxide solution 22 is circulated. The first reason is that in the case where the two-bath-type processing bath 20 is used as shown in FIG. 3, the area of contact between the ammonia-hydrogen peroxide solution 22 and atmospheric air is increased because the structure is such that the ammonia-hydrogen peroxide solution 22 overflows out of the inner bath 201 into the outer bath 202 when the ammonia-hydrogen peroxide solution 22 is circulated. The second reason is that oxygen dissolved in the ammonia-hydrogen peroxide solution 22 escapes from the solution by a cavitation effect due to changes in pressure in the circulation pump 32.

The inventor of the present invention earnestly made studies and found that the decomposition of hydrogen peroxide in the ammonia-hydrogen peroxide solution can be inhibited by dissolving titanium in advance. This enables constantly maintaining the etching rate for a long time period. The reason that the decomposition of hydrogen peroxide is inhibited if titanium is dissolved immediately after the preparation of the ammonia-hydrogen peroxide solution will be described below. A reaction of hydrogen peroxide shown by formula 1 below occurs in an alkaline solution to produce a hydroperoxy radical. i.e., OOH.

$$H_2O_2 + OH \Leftrightarrow H_2O + OOH \quad \text{(formula 1)}$$

It is thought that the hydroperoxy radical acts to promote the decomposition of hydrogen peroxide by reacting with hydrogen peroxide in an alkaline solution. It is thought that the reaction shown by formula 2 below occurs and the decomposition of $H_2O_2$ progresses at an increasingly fast rate.

$$H_2O_2 + OOH \rightarrow O_2 + H_2O + OH \quad \text{(formula 2)}$$

By dissolving titanium in the ammonia-hydrogen peroxide solution, a reaction shown by formula 3 below is caused.

$$TiOOH + NH_3 = NH_2OH/TiOH \quad \text{(formula 3)}$$

The hydroperoxy radical is consumed with priority to produce hydroxylamine. Hydroxylamine, i.e., $NH_2OH$, is a salt of titanium. Because the reaction shown by formula 3 is caused, the reaction of the hydroperoxy radical causing decomposition of hydrogen peroxide as shown by formula 2 can be inhibited. The amount of titanium to be dissolved in the ammonia-hydrogen peroxide solution 22 may be experimentally determined so that the reaction shown by formula 2 above is sufficiently inhibited.

(Step S106)

Figure 6:
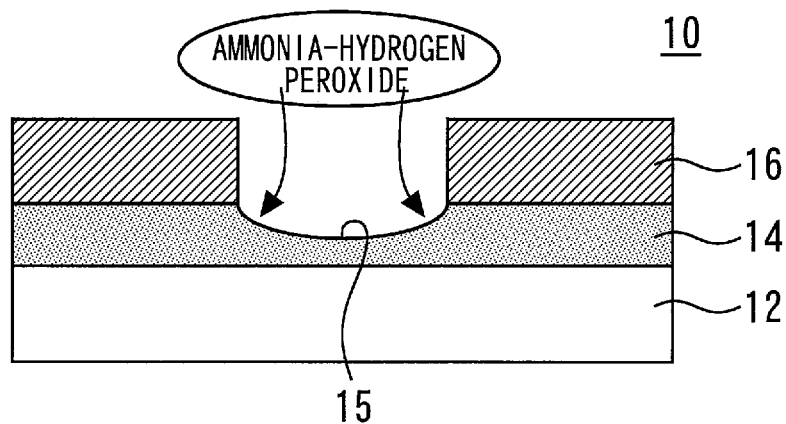
FIG. 6 is a diagram showing an etching step according to the embodiment of the present invention.

Subsequently, in step S106, the SiC wafer 10 is put in the processing bath 20 and immersed in the etching solution 29. FIG. 6 is a diagram showing an etching step according to the embodiment of the present invention. The SiC wafer 10 to be etched has a titanium film 14 laid on an SiC substrate 12 and a resist film 16 laid on the titanium film 14 and has the resist film 16 patterned into a desired shape. FIG. 6 shows a state where an etched groove 15 is formed in the titanium film 14.

In the present embodiment, the titanium film 14 on the SiC wafer 10 is etched in step S106. The present invention, however, is not limited to this. A film of a metal other than titanium may be etched by using the etching solution 29. For example, nickel film may be laid instead of the titanium film 14 on the SiC wafer 10 and etched in step S106. From the viewpoint of prevention of contamination, however, it is preferable that the metal dissolved in advance and the metal to be etched be the same. The manufacturing method according to the present embodiment is therefore suitable for etching on the titanium film 14. Since each of titanium and nickel is Schottky-junctioned to silicon carbide, the etching method according to the present embodiment is preferably used for forming a Schottky barrier electrode on the SiC substrate 12.

Figure 7:
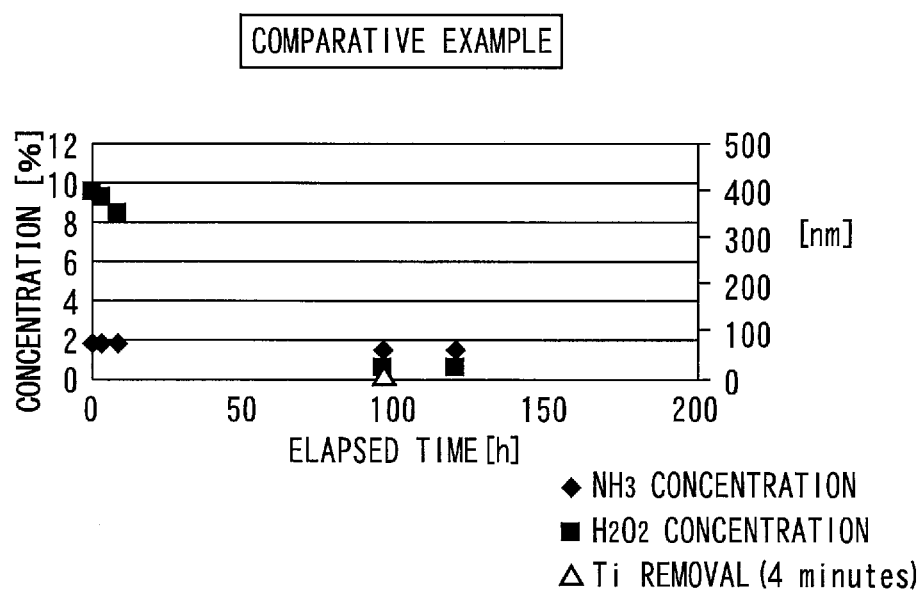
FIG. 7 is a diagram showing the results of an experiment on a comparative example compared with the embodiment.
Figure 8:
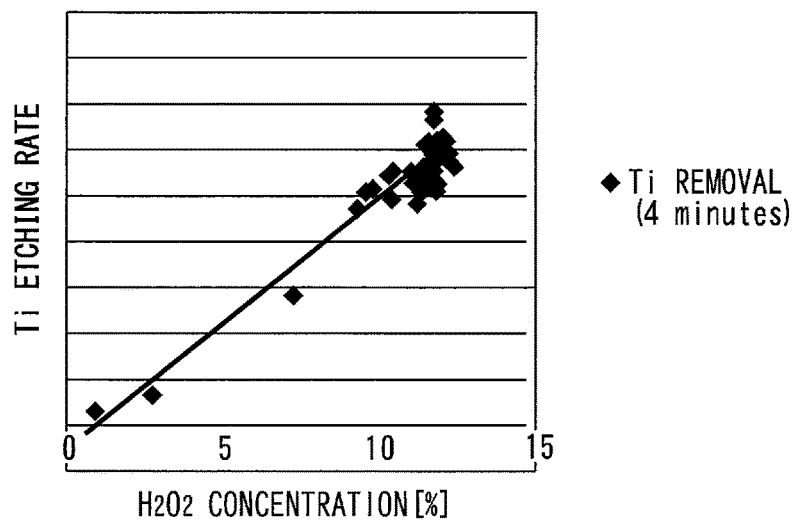
FIG. 8 is a diagram showing the results of experiments on the embodiment of the present invention.
Figure 9:
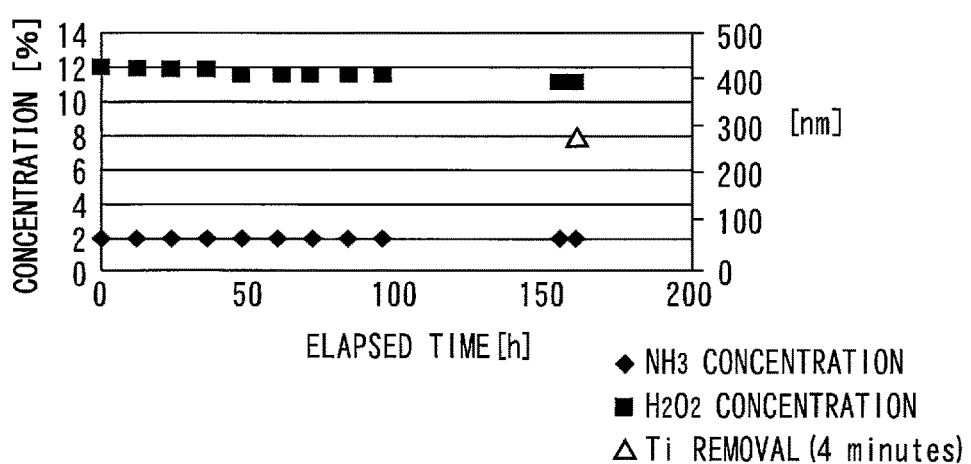
FIG. 9 is a diagram showing the results of experiments on the embodiment of the present invention.

The results of experiments on the embodiment of the present invention will be described below with reference to FIGS. 7 to 9. FIG. 7 is a diagram showing the results of an experiment on a comparative example compared with the embodiment. FIGS. 8 and 9 are diagrams showing the results of experiments on the embodiment of the present invention. In FIGS. 7 and 9, the $NH_3$ concentration is plotted with a rhombus; the $H_2O_2$ concentration, with a square; and the amount of removal of titanium in a case where the SiC wafer 10 is immersed in the etching solution 29 for 4 minutes, with a triangle. In FIGS. 7 and 9, the scale on the left-hand side indicates the concentration [%] while the scale on the right-hand side indicates the amount of removal of titanium film [nm].

FIG. 7 is a diagram showing the results of an experiment using, as a comparative example, an ammonia-hydrogen peroxide solution in which titanium is not dissolved. The results are changes in concentration with respect to elapsed time and an amount of removal of titanium. The elapsed time is a time elapsed after the preparation of the ammonia-hydrogen peroxide solution. In a region where the elapsed time was 0 to about 10 hours immediately after the start of the experiment, the $H_2O_2$ concentration lowered rapidly to 10% or less. When the elapsed time became about 100 hours, the $H_2O_2$ concentration lowered to about 1 to 0%. The amount of removal of titanium was measured at the stage at which the elapsed time was 100 hours and found to be substantially zero nm.

FIG. 8 shows the relationship between the $H_2O_2$ concentration and the titanium etching rate. The amount of removal of titanium in the case where the SiC wafer 10 was immersed in the etching solution 29 for 4 minutes was plotted with respect to the $H_2O_2$ concentration changed. If the $H_2O_2$ concentration is reduced, the titanium etching rate lowers, as shown in FIG. 8.

FIG. 9 shows the results of an experiment using the etching solution 29 according to the present embodiment. In contact to the results shown in FIG. 7, the reduction in $H_2O_2$ concentration was extremely small even when the elapsed time became 100 hours or longer. The reduction in $H_2O_2$ concentration was stable at about 12%. Etching of the titanium film 14 was performed at a stage at which the elapsed time was about 160 hours in the experiment on the present embodiment. The amount of removal by this etching was about 300 nm. Thus, in the present embodiment, the etching rate can be constantly maintained for a long time period by inhibiting the decomposition of hydrogen peroxide in the ammonia-hydrogen peroxide solution.

REFERENCE SIGNS LIST

10 SiC wafer
12 SiC substrate
14, 42 titanium film
15 etched groove
16 resist film
20 processing bath
22 ammonia-hydrogen peroxide solution
24 ammonia water
26 hydrogen peroxide solution
28 pure water
29 etching solution
30 first piping
32 circulation pump
34 temperature controller
36 second piping
38 concentration meter
39 droplets
40 semiconductor substrate
44 semiconductor wafer
50 wet etching apparatus
201 inner bath
202 outer bath

The invention claimed is:

1. A method for manufacturing a semiconductor device, comprising:
   a preparation step of preparing an etching solution by dissolving titanium in an ammonia-hydrogen peroxide solution in advance before use of the ammonia-hydrogen peroxide solution for etching;
   a flow step of flowing the etching solution after the preparation step so that a concentration of the etching solution in a processing bath is constant; and
   a processing step of etching a metal film on a semiconductor wafer with the etching solution by putting in the processing bath the semiconductor wafer having a resist film and the metal film after the flow step is started.

2. The method for manufacturing a semiconductor device according to claim 1, wherein the metal film is formed of titanium.

3. The method for manufacturing a semiconductor device according to claim 1, wherein a temperature of the etching solution is adjusted by flowing the etching solution so that the etching solution flows via a temperature controller.

4. The method for manufacturing a semiconductor device according to claim 1, wherein the processing bath includes a first bath in which the etching solution is stored, a second bath into which the etching solution overflowing from the first bath flows, and a flow passage connecting the first bath and the second bath, and
   wherein, in the flow step, the etching solution is circulated from the second bath to the first bath through the flow passage.

5. The method for manufacturing a semiconductor device according to claim 1, wherein the semiconductor wafer is an SiC wafer and the metal film is Schottky-junctioned to the SiC wafer.

* * * * *